US012645304B2

(12) United States Patent  (10) Patent No.:  US 12,645,304 B2

Toda  (45) Date of Patent:  Jun. 2, 2026

(54) TOUCH AND PUSH OPERATION APPARATUS FOR ELECTRONIC APPARATUS

(71) Applicant: CANON KABUSHIKI KAISHA, Tokyo (JP)

(72) Inventor: Daisuke Toda, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/610,176

(22) Filed: Mar. 19, 2024

(65) Prior Publication Data

US 2024/0411380 A1  Dec. 12, 2024

(30) Foreign Application Priority Data

Jun. 12, 2023  (JP) ................................ 2023-095992

(51) Int. Cl.
*G06F 3/02*  (2006.01)
*H03K 17/96*  (2006.01)

(52) U.S. Cl.
CPC ......... *G06F 3/0202* (2013.01); *H03K 17/962* (2013.01)

(58) Field of Classification Search
CPC ............................ G06F 3/0202; H03K 17/962
See application file for complete search history.

(56) References Cited

U.S. PATENT DOCUMENTS

| | | | | |
|---|---|---|---|---|
| 10,707,032 B1* | 7/2020 | Ely | | H05K 5/0017 |
| 2008/0202251 A1* | 8/2008 | Serban | | H03K 17/962 |
| | | | | 29/25.03 |
| 2017/0178838 A1* | 6/2017 | Ohira | | H01H 13/70 |
| 2018/0275769 A1* | 9/2018 | Ikeda | | G06F 3/039 |
| 2019/0129553 A1* | 5/2019 | Oh | | G06F 1/1643 |
| 2020/0110487 A1* | 4/2020 | Schmitt | | G06F 3/044 |
| 2020/0152402 A1* | 5/2020 | Su | | H01H 13/85 |
| 2022/0155903 A1* | 5/2022 | Saito | | G06F 3/0202 |

FOREIGN PATENT DOCUMENTS

| | | | | | |
|---|---|---|---|---|---|
| CN | 103049130 A | * | 4/2013 | .......... | G06F 3/0412 |
| JP | 2014123430 A | | 7/2014 | | |

* cited by examiner

*Primary Examiner* — Stephen G Sherman

(74) *Attorney, Agent, or Firm* — Cowan, Liebowitz & Latman, P.C.

(57) ABSTRACT

An operation apparatus to be provided to an electronic apparatus includes an operation member configured to receive a touch operation and a press operation that moves the operation member from a position where the touch operation is performed, a first electrode configured to move as the operation member moves, a second electrode disposed so as to change a distance from the first electrode that is moving, and a detector configured to detect a capacitance change generated in the first electrode by the touch operation and a capacitance change generated in the first electrode as the distance changes.

9 Claims, 9 Drawing Sheets

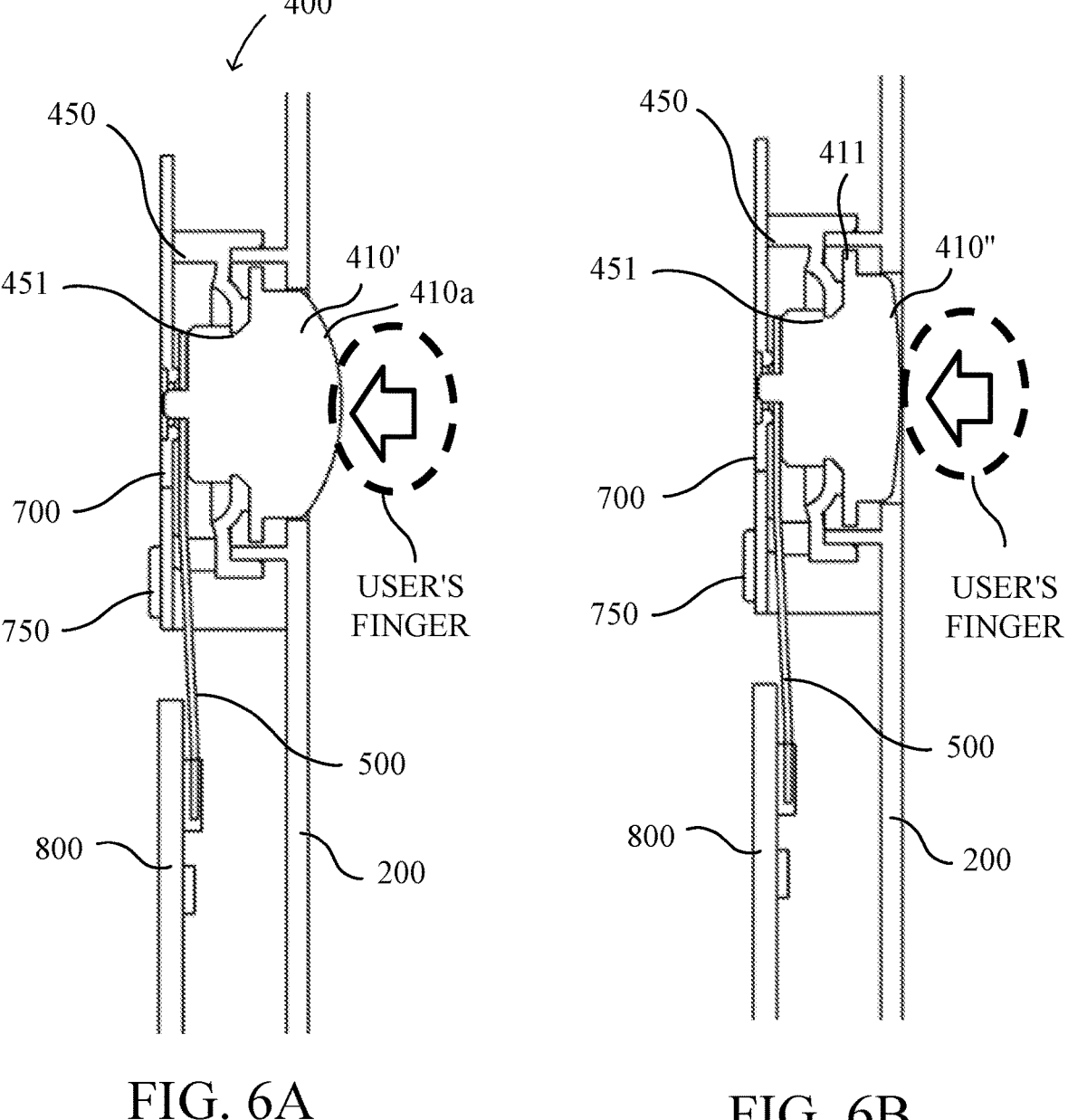
FIG. 6A                    FIG. 6B

TOUCH AND PUSH OPERATION APPARATUS FOR ELECTRONIC APPARATUS

BACKGROUND

Technical Field

One of the aspects of the embodiments relates to an operation apparatus for a digital camera and another electronic apparatus.

Description of Related Art

Some of the above operation apparatuses detect a touch operation by a target (object to be detected) such as a user's finger or an approach of the target through a capacitance change. Japanese Patent Laid-Open No. 2014-123430 discloses an input apparatus configured to detect a capacitance change due to a touch operation (including approach operation) of a target to a movable electrode and a capacitance change of a fixed electrode associated with a distance change between the movable electrode and the fixed electrode due to a press operation by the target.

In detecting the touch operation and the press operation using a single capacitance detecting system as in the input apparatus disclosed in Japanese Patent Laid-Open No. 2014-123430, it is difficult to stably detect which operation has been performed based on the detected capacitance.

SUMMARY

An operation apparatus to be provided to an electronic apparatus according to one aspect of the disclosure includes an operation member configured to receive a touch operation and a press operation that moves the operation member from a position where the touch operation is performed, a first electrode configured to move as the operation member moves, a second electrode disposed so as to change a distance from the first electrode that is moving, and a detector configured to detect a capacitance change generated in the first electrode by the touch operation and a capacitance change generated in the first electrode as the distance changes. An electronic apparatus having the above operation apparatus also constitutes another aspect of the disclosure.

Further features of various embodiments of the disclosure will become apparent from the following description of embodiments with reference to the attached drawings.

BRIEF DESCRIPTION OF THE DRAWINGS

FIGS. 6A and 6B are other sectional views of the operation unit according to the first embodiment.

DESCRIPTION OF THE EMBODIMENTS

Embodiments of the present disclosure will be described below with reference to the drawings.

First Embodiment

Figures 1, 2A, 2B:
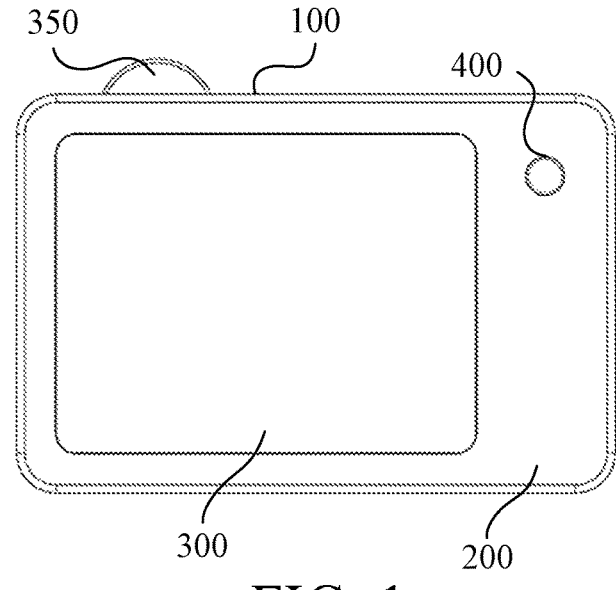
FIG. 1 is an external view of an electronic apparatus according to a first embodiment.
FIGS. 2A and 2B are sectional views of an operation unit in the electronic apparatus according to the first embodiment.

FIG. 1 illustrates the external appearance (rear side) of an electronic apparatus 100 according to a first embodiment. The electronic apparatus 100 includes an exterior housing 200 as an exterior member, a display unit 300, a dial 350, and an operation unit 400 as an operation apparatus. The display unit 300 includes a liquid crystal display (LCD) device or the like, and displays various information regarding the electronic apparatus 100 and images. The user can operate the dial 350 and the operation unit 400 to instruct the electronic apparatus 100 to operate or change settings. At this time, the user can confirm a response of the electronic apparatus 100 to an operation to the display unit 300.

Figure 3A:
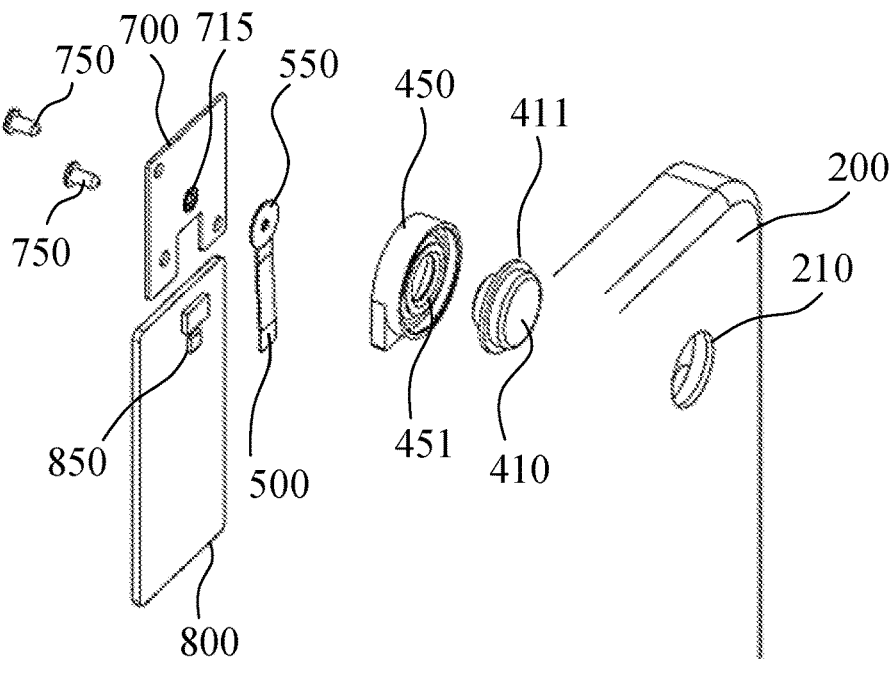
FIGS. 3A and 3B are exploded perspective views of the operation unit according to the first embodiment.
Figure 3B:
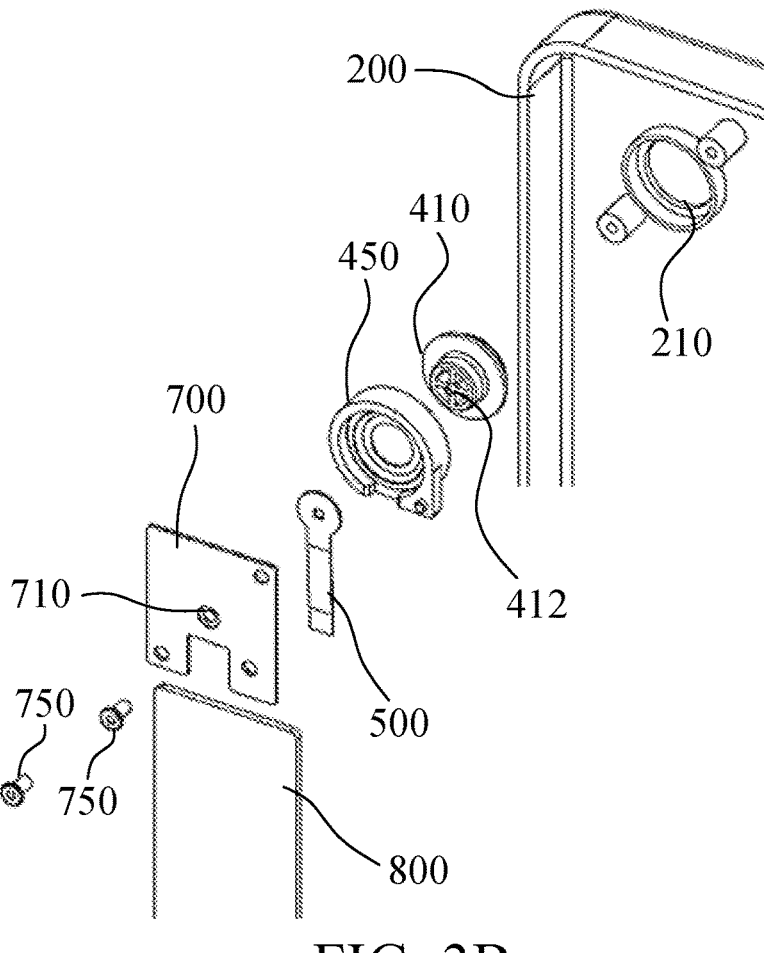

FIGS. 2A and 2B are partially sectional views of the electronic apparatus 100 including the operation unit 400, and FIGS. 3A and 3B are partially exploded perspective views of the operation unit 400.

The operation unit 400 according to this embodiment is to receive a touch operation and a press operation to a key top 410 as the operation member. The touch operation referred to herein includes not only a touch operation of the key top 410 as described below but also an operation of approaching the key top 410. This embodiment will discuss an operation by a user's finger to the key top 410, but is applicable to an operation by a target (object to be detected) such as a user's finger, an operating pen held by the user, or an operating glove worn by the user.

In the following description, a direction in which the key top 410 is pressed and moved in the electronic apparatus 100 will be referred to as a depth side (a front surface side of the electronic apparatus 100). The key top 410 is disposed in a buttonhole 210, which is an opening formed in the exterior housing 200, so that its operation surface is exposed to the outside.

A key flange 411 is formed on the outer circumference of the key top 410 and disposed on the depth side of the operation surface. The key flange 411 contacts the inner surface of the exterior housing 200 to limit the protrusion of the key top 410 to the outside. A rubber engagement portion 451 of a key rubber 450, which is an elastic member, is engaged with a groove portion disposed on the depth side of the key flange 411 of the key top 410, and thereby the key top 410 is held while biased toward the outside.

In a case where the key top 410 is pressed toward the depth side from the touch operation state (projected position) with the user's finger as illustrated in FIG. 2A, the key rubber 450 is elastically deformed and the key top 410 moves to the depth side as illustrated in FIG. 2B. In a case where the press operation is released, the shape of the key rubber 450 is restored and the key top 410 is pressed back to its original position (touch operation position or projected position). The key rubber 450 is formed so as to give a click feeling in a case where the key top 410 is pressed by a predetermined amount.

A portion on one end side of the flexible printed circuit (FPC) substrate 500 is adhered to and held on the bottom surface of the key top 410 (end surface on the depth side) with double-sided tape 550. A key top boss 412 is provided on the bottom surface, and by inserting the key top boss 412 into a hole portion 505 provided in the FPC substrate 500, the FPC substrate 500 is positioned relative to the key top 410 (bottom surface). The other end of FPC substrate 500 is electrically connected to an electronic circuit substrate 800. Details of the FPC substrate 500 and the electronic circuit substrate 800 will be described below.

A receiving metal plate (receiving sheet metal) 700 made of a conductive metal plate is disposed on the depth side of the FPC substrate 500 and separated from the FPC substrate 500 by a predetermined distance in the state illustrated in FIG. 2A. The receiving metal plate 700 serves as a receiving surface in a case where the key top 410 is pressed. A metal surface of the receiving metal plate 700 on the FPC substrate side (first electrode side) is exposed without being covered with an insulation film. The receiving metal plate 700 is fixed and electrically connected (grounded) to the inner part of the exterior housing 200 formed of conductive metal by a conductive screw 750. A metal-plate hole 710 is formed in the receiving metal plate 700 to avoid the key top boss 412 in a case where the key top 410 is pressed to its operation end as its movement end, as illustrated in FIG. 2B.

Figure 4:
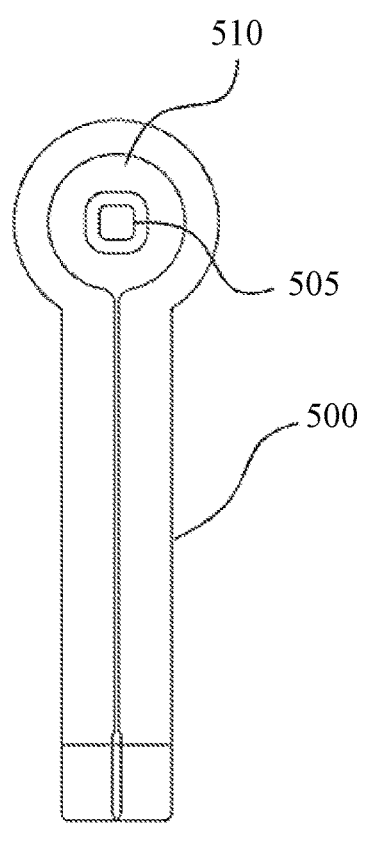
FIG. 4 illustrates a flexible printed circuit (FPC) substrate in the operation unit according to the first embodiment.

FIG. 4 illustrates the FPC substrate 500 viewed from the back side (receiving metal plate side). The FPC substrate 500 has the hole portion 505 into which the key top boss 412 is inserted. An electrode pattern 510 as a first electrode is formed on the FPC substrate 500 using copper foil. The surface of the electrode pattern 510 is covered and insulated with an insulation film such as polyimide. A capacitance sensor 850 as a detector that detects capacitance generated in the electrode pattern 510 is mounted on the electronic circuit substrate 800 to which the FPC substrate 500 is electrically connected. Due to this configuration, the capacitance sensor 850 can detect a change in the electric charge (capacitance) stored in the electrode pattern 510 when a distance between the electrode pattern 510 and the receiving metal plate 700 as the second electrode changes.

In this embodiment, the area of the portion of the electrode pattern 510 corresponding to the bottom surface of the key top 410 is set to be larger than other portions. This increases the capacitance change generated when the key top 410 is touched or pressed.

The detection result of the capacitance sensor 850 is compared with a threshold set on the program as described below by an unillustrated processing circuit (control unit) mounted on the electronic circuit substrate 800. Whether there is a touch operation or press operation to the key top 410 is determined based on the comparison result. The processing circuit may simply determine whether there is a touch operation or a press operation, or may further control the operation of the electronic apparatus 100 according to the determination result.

Figure 5:
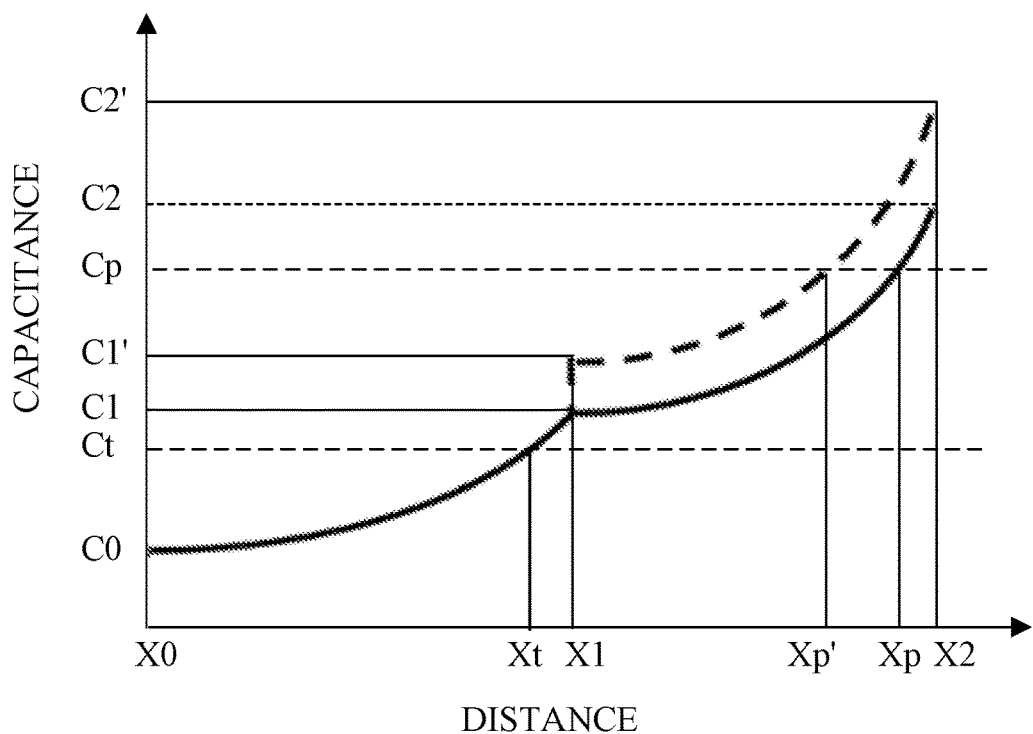
FIG. 5 illustrates a capacitance change in the first embodiment.

FIG. 5 illustrates a relationship among a distance of the user's finger to the key top 410 (that is, the electrode pattern 510), a distance between the electrode pattern 510 and the receiving metal plate 700, and the capacitance generated in the electrode pattern 510. A horizontal axis represents a distance X, and the distance X becomes shorter toward the right side of FIG. 5. A vertical axis represents the capacitance C detected by the capacitance sensor 850, and the capacitance C increases toward the upper side of FIG. 5.

In this embodiment, the user's finger approaches the operation surface of the key top 410 from a position away from the key top 410 and realizes the touch operation, and then presses the key top 410 to move the key top 410 to the depth side. The movement of the key top 410 stops at the operation end where the bottom surface (FPC substrate 500) of the key top 410 that has moved by a predetermined amount comes into contact with the receiving metal plate 700. In general, capacitance C is expressed by $C = \varepsilon \cdot S/D$, where S is the area of the first electrode, D is a distance between the first electrode and the second electrode, and $\varepsilon$ is a dielectric constant of air.

The capacitance C of the electrode pattern 510 increases in the process from a state in which the user's finger does not touch the key top 410 (touch operation is not performed) to a state in which the user's finger at the ground level approaches and contacts the key top 410. The capacitance C of the electrode pattern 510 increases as the distance X between the electrode pattern 510 and the receiving metal plate 700 decreases up to the operation end where the key top 410 is pressed and the FPC substrate 500 comes into contact with the receiving metal plate 700. Since the electrode pattern 510 and the receiving metal plate 700 are insulated, the capacitance C is maximum at the operation end.

In FIG. 5, X0 indicates the distance X in a case where the user's finger is sufficiently far away from the key top 410, and C0 is an initial value of capacitance C detected by the capacitance sensor 850 in this state. From this state, the capacitance C increases as the user's finger approaches the key top 410 (that is, electrode pattern 510). X1 indicates a touch operation state in which the user's finger comes into contact with the key top 410, and C1 is the capacitance at this time. The processing circuit described above sets first threshold Ct between C0 and C1, and determines that a touch operation to the key top 410 has been performed in a case where the capacitance C reaches Ct. Xt indicates the distance X in a case where the capacitance C reaches Ct.

Thereafter, in a case where the user presses the key top 410 and the electrode pattern 510 approaches the receiving metal plate 700, the capacitance C further increases. In a case where the distance X becomes the distance X2 at the operation end, the capacitance C reaches C2. The processing circuit described above sets a second threshold Cp between C1 and C2, and determines that the key top 410 has been pressed when the capacitance C reaches Cp, where Xp is the distance X when the capacitance C reaches Cp.

The second threshold Cp may be set sufficiently lower than C2 so that C2 reliably becomes higher than Cp at the operation end in order to prevent the press operation from not being detected. On the other hand, C1 and C2 change depending on how the user's fingers touch the key top 410. For example, in a case where the contact area of the user's finger on the key top 410 is large, C1 and C2 become higher. The change in capacitance C under this condition is illustrated by a broken line in FIG. 5. The capacitance when the key top 410 contacts the user's finger is C1' (Ct<C1<C1'<Cp), and the capacitance at the operation end is C2'(>C2).

As described above, the operation unit 400 according to this embodiment has a simple configuration but can detect two-step operations.

Figure 7A:
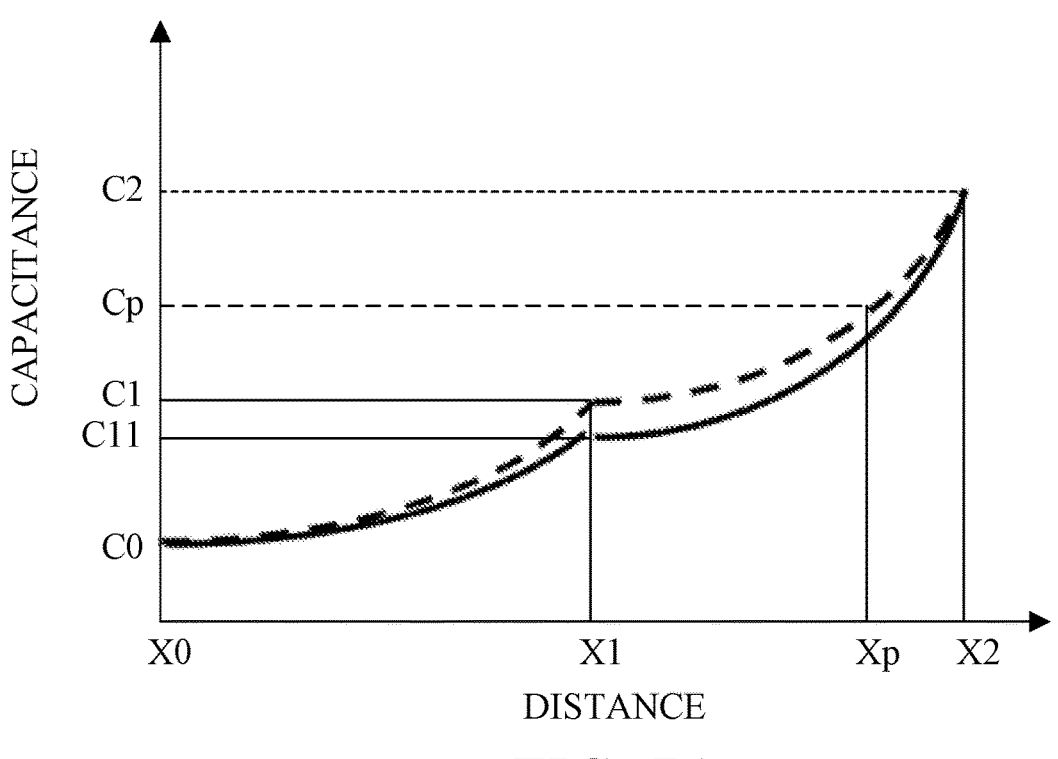
FIGS. 7A and 7B illustrate a capacitance change in the operation unit in FIGS. 6A and 6B.

Referring now to FIGS. 6A, 6B, 7A, and 7B, a description will be given of a relationship between the shape of the key top 410 and the capacitance. FIG. 6A illustrates a section of the key top 410', which has an operation surface 410a with a shape different from that of the operation surface illustrated in FIGS. 2A and 2B, and has been pressed to the operation end. FIG. 7A illustrates, using a solid line, a capacitance change generated in the electrode pattern 510 in a case where the key top 410' of FIG. 6A is used. FIG. 7A also illustrates, using a broken line, a capacitance change generated in the electrode pattern 510 in a case where the key top 410 of FIGS. 2A and 2B is used.

The operation surface 410a of the key top 410' has a convex shape with a stronger curvature than that of the substantially flat operation surface of the key top 410 illustrated in FIGS. 2A and 2B. On the operation surface 410a of the key top 410', the contact area with the user's finger when the user's finger touches the operation surface 410a is smaller than that of the key top 410 illustrated in FIGS. 2A and 2B. Therefore, as illustrated by the solid line in FIG. 7A, capacitance C11 at the distance X1 is smaller than the capacitance C1 illustrated by the broken line. In a case where the key top 410' is pressed from here, the user's finger comes into close contact with the operation surface 410a of the key top 410', increasing the contact area, and capacitance C reaches capacitance C2 at distance X2. Thereby, a capacitance change amount while the distance X decreases from X1 to X2 can be larger than that of the broken line by a difference between the capacitance C1 and the capacitance C11 at distance X1. That is, a difference between threshold Cp and capacity C11 can be further increased.

For example, even if X1 and X2 are close to each other in the configuration of the operation unit 400 due to size variations due to individual differences in each component, the difference between threshold Cp and the capacitance C11 can be further increased. As a result, the processing circuit can be prevented from erroneously determining that a press operation has been performed even though the user only performs a touch operation to the key top 410', and thus a malfunction can be avoided.

Figure 7B:
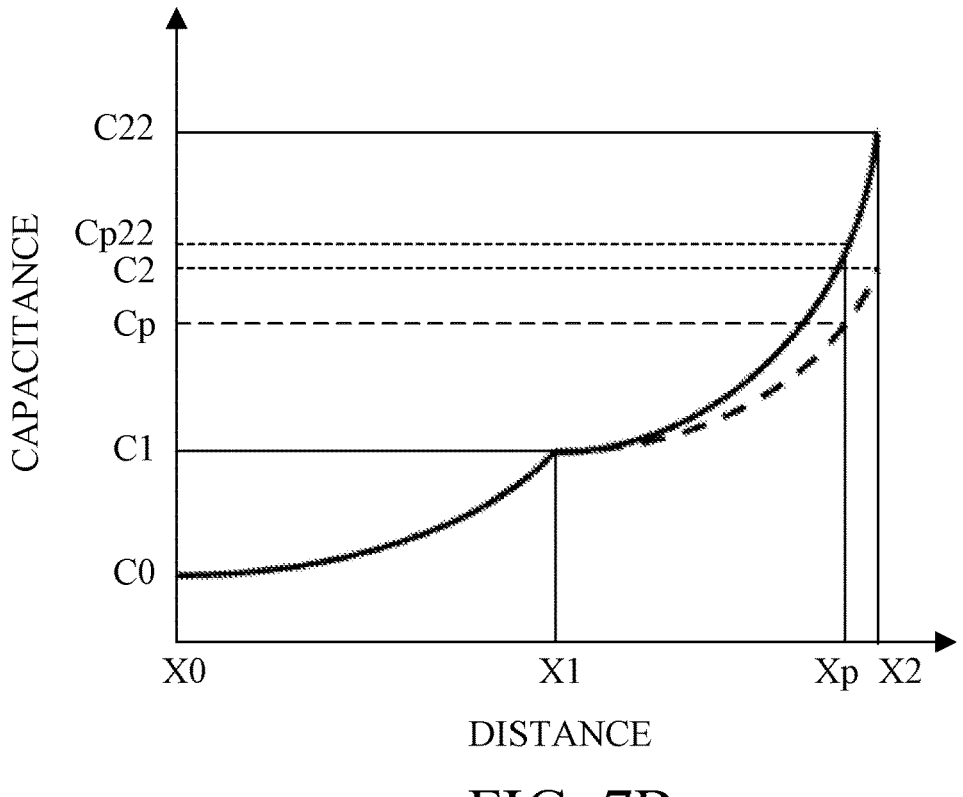

In the sectional view of FIG. 6B, the key top 410" has an operation surface having the same shape as that of the key top 410 in FIGS. 2A and 2B, but the height from the key flange 411 to the operation surface of the key top 410" is lower than that of the key top 410 illustrated in FIGS. 2A and 2B, and the key top 410" is pressed down to the operation end. FIG. 7B illustrates, using a solid line, a capacitance change generated in the electrode pattern 510 in a case where the key top 410" illustrated in FIG. 6B is used. FIG. 7B also illustrates, using a broken line, a capacitance change generated in the electrode pattern 510 in a case where the key top 410 illustrated in FIGS. 2A and 2B is used.

As illustrated in FIG. 6B, the operation surface of the key top 410" at the operation end sinks deeper into the inner surface (inner side) than the outer surface of the exterior housing 200. At this time, the user's finger may come into contact with the exterior housing 200 at the ground level, and the capacitance changes. As described above, the receiving metal plate 700 is electrically connected to the exterior housing 200 via the screw 750. Therefore, as illustrated by the solid line in FIG. 7B, the capacitance C22 at the operation end is larger than the capacitance C2 in a case where the key top 410 illustrated in FIGS. 2A and 2B is used. Therefore, a capacitance change amount can be increased by the difference between the capacitance C2 and the capacitance C22 at the distance X2 while the distance X decreases from X1 to X2. As a result, the degree of freedom in setting the threshold Cp increases. For example, the threshold Cp can be changed to threshold Cp22 to further increase a difference between threshold Cp22 and the capacitance C1.

For example, even if X1 and X2 are close to each other in the configuration of the operation unit 400 due to size variations due to individual differences in each component, the difference between the threshold Cp22 and the capacitance C1 can be further increased. As a result, the processing circuit can be prevented from erroneously determining that a press operation has been performed even though the user only performs a touch operation to the key top 410', and thus a malfunction can be avoided.

Figures 8A, 8B, 8C:
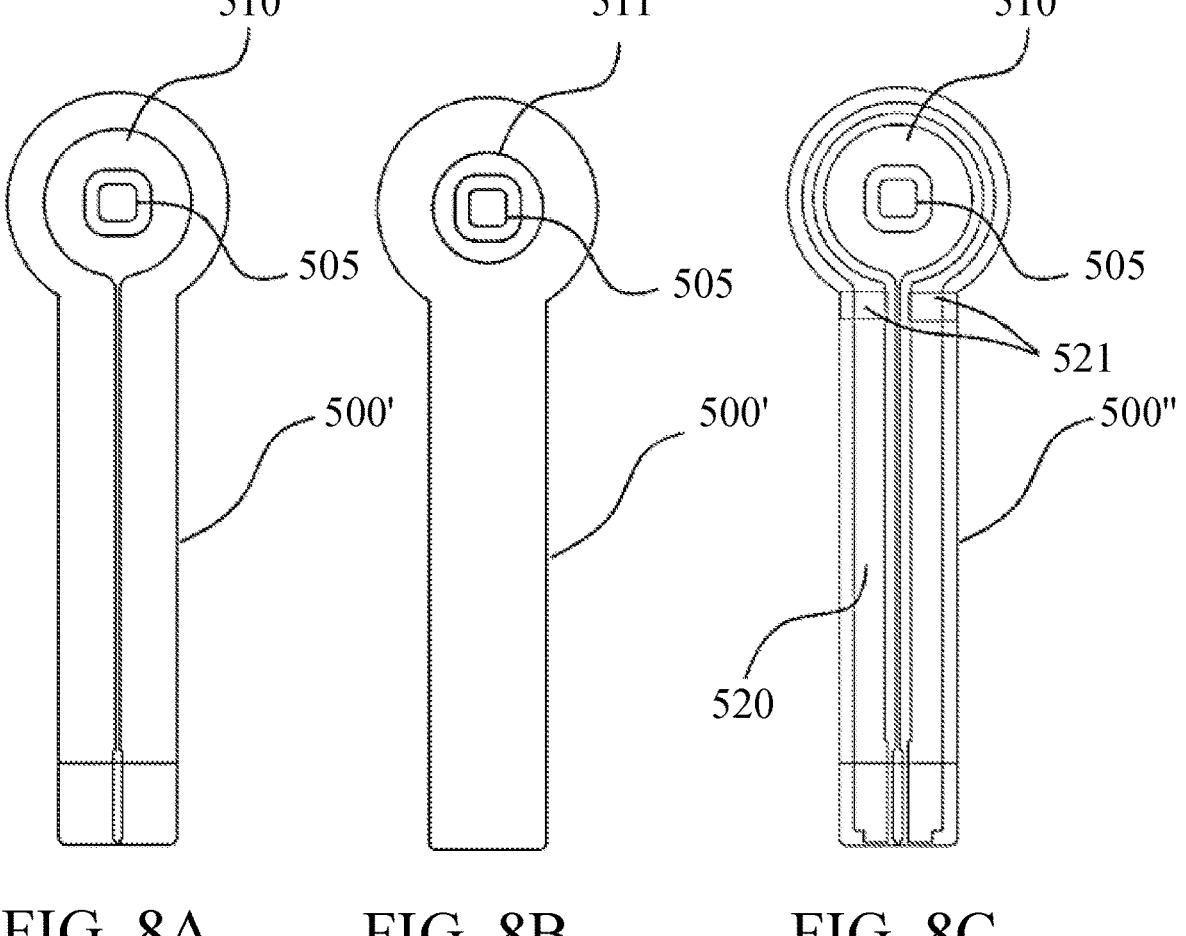
FIGS. 8A, 8B, and 8C illustrate a variation of the FPC substrate in the operation unit according to the first embodiment.
Figure 9:
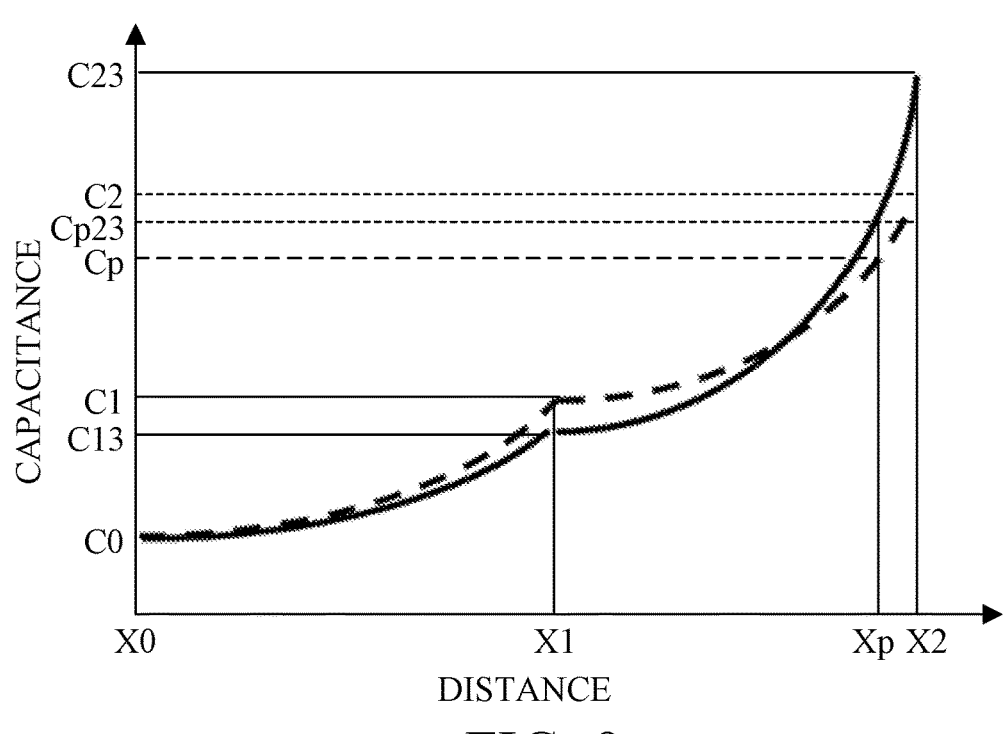
FIG. 9 illustrates a capacitance change in the operation unit in FIGS. 8A and 8B.

Referring now to FIGS. 8A, 8B, and 9, a description will be given of a variation of the FPC substrate 500. FIGS. 8A and 8B illustrate an FPC substrate 500' having a configuration different from that of the FPC substrate 500 illustrated in FIG. 4. The FPC substrate 500' has the same electrode pattern 510 as that of the FPC substrate 500 illustrated in FIG. 4 on the receiving plate side, but is different from the FPC substrate 500 illustrated in FIG. 4 in having an electrode pattern 511 illustrated in FIG. 8B on the key top side (operation member side). FIG. 9 illustrates, using a solid line, a capacitance change generated in the electrode pattern 510 in a case where the FPC substrate 500' illustrated in FIGS. 8A and 8B is used. FIG. 9 also illustrates, using a broken line, a capacitance change generated in the electrode pattern 510 in a case where the FPC substrate 500 illustrated in FIG. 4 is used.

In the FPC substrate 500', the area of the electrode pattern 510 on the receiving plate side illustrated in FIG. 8A is larger than the area of the electrode pattern 511 on the key top side illustrated in FIG. 8B. This configuration can detect a small capacitance change in the electrode pattern 511 on the key top side and a large capacitance change in the electrode pattern 510 on the receiving plate side.

As illustrated in FIG. 9, capacitance C13 of the electrode pattern 510 at the distance X1 in a case where the FPC substrate 500' illustrated in FIGS. 8A and 8B is used is smaller than the capacitance C1 in a case where the FPC substrate 500 illustrated in FIG. 4 is used. On the other hand, capacitance C23 of the electrode pattern 510 at the distance X2 in a case where the FPC substrate 500' illustrated FIGS. 8A and 8B is used is larger than the capacitance C2 in a case where the FPC substrate 500 illustrated in FIG. 4 is used. As a result, by using the FPC substrate 500' illustrated in FIGS. 8A and 8B, a capacitance change amount generated while the distance X decreases from X1 to X2 can be larger than that in a case where the FPC substrate 500 illustrated in FIG. 4 is used. Therefore, by using the FPC substrate 500' illustrated in FIGS. 8A and 8B, the degree of freedom in setting the threshold Cp23 instead of the threshold Cp increases. That is, the difference between the threshold Cp23 and the capacitance C13 can be further increased.

For example, even if X1 and X2 are close to each other in the configuration of the operation unit 400 due to size variations due to individual differences in each component, the difference between the threshold Cp23 and the capacitance C13 can be further increased. As a result, the processing circuit can be prevented from erroneously determining that a press operation has been performed even though the user only performs a touch operation to the key top 410, and thus a malfunction can be avoided.

FIG. 8C illustrates an FPC substrate 500" having a GND pattern according to a variation of the FPC substrate 500. The FPC substrate 500" has the GND pattern 520 as a ground electrode on the outer circumference of the electrode pattern 510 on the receiving plate side. The GND pattern 520 is exposed to the receiving plate side through openings 521 provided at a position away from the bottom surface of the key top 410 in the insulation film on the FPC substrate 500".

Figure 10:
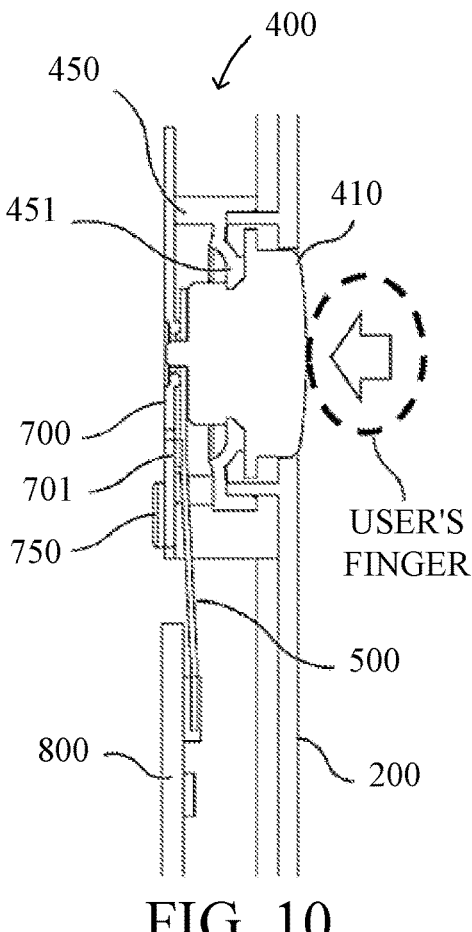
FIG. 10 is a sectional view of an operation unit according to a second embodiment.

FIG. 10 illustrates a section of the key top 410 pressed to the operation end in a case where the FPC substrate 500" illustrated in FIG. 8C is used. A protrusion 701 that protrudes toward the key top side (FPC substrate side) is added to the receiving metal plate 700 illustrated in FIGS. 2A and 2B.

In a case where the key top 410 is pressed to the operation end, the GND pattern 520 of the FPC substrate 500" comes into contact with the protrusion 701 of the receiving metal plate 700 through the openings 521. Thereby, as illustrated in FIG. 7B, the capacitance C22 at the distance X2 can be increased.

The processing circuit described above detects the touch operation and press operation to the operation unit 400, and thereby performs an operation corresponding to each of the touch operation and the press operation. For example, in a case where the electronic apparatus 100 is an image pickup apparatus such as a digital camera, the processing circuit changes the exposure value setting in a case where the user performs the touch operation to the operation unit 400 and rotates the dial 350. In a case where the user performs the press operation to the operation unit 400 and rotates the dial 350, the processing circuit changes the ISO speed value setting. Various functions can be assigned, such as assigning an autofocus (AF) area change in AF in response to the touch operation, and assigning an AF mode change in response to the press operation.

Second Embodiment

Figures 11A, 11B, 11C:
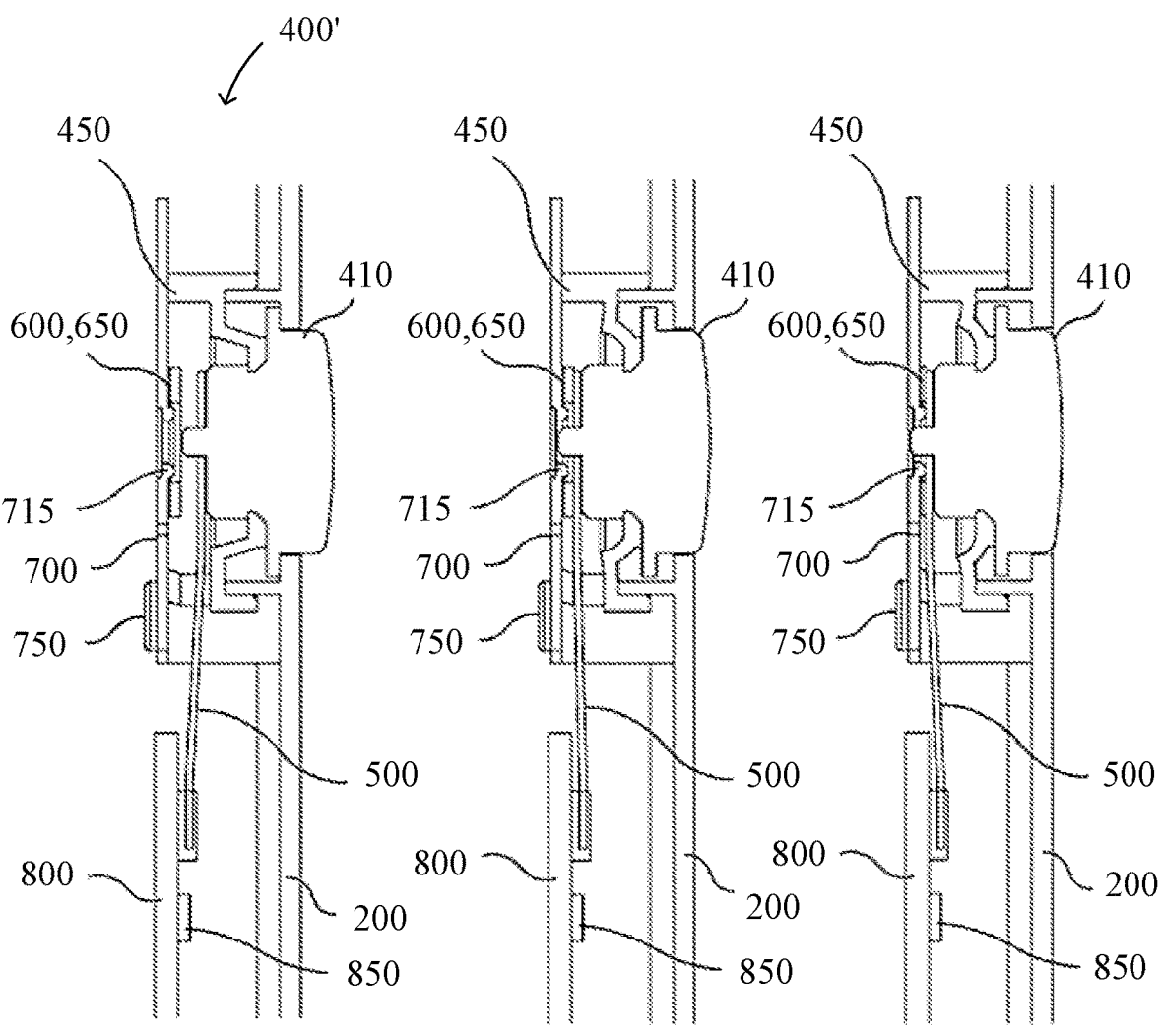
FIGS. 11A, 11B, and 11C illustrate an operation of the operation unit in FIG. 10.

FIGS. 11A, 11B, and 11C illustrate sections of the operation unit 400' according to a second embodiment. FIG. 11A illustrates a state before a touch operation is performed, and FIG. 11B illustrates a state in which the key top 410 has been pressed to a first operation end corresponding to the operation end described in the first embodiment. In this embodiment, in addition to the operation unit 400 according to the first embodiment, an elastic member 600 is placed on the receiving metal plate 700 and fixed with double-sided tape 650. The elastic member 600 has an annular shape, and a metal-plate convex portion 715 formed around a metal-plate hole 710 in the receiving metal plate 700 is exposed from its central opening.

As illustrated in FIG. 11B, in a case where the key top 410 is pressed to the first operation end, the FPC substrate 500 comes into contact with the elastic member 600. That is, the key top 410 is pressed down to a position corresponding to the elastic member 600. In a case where the user further applies a pressing force to the key top 410 from this state, the key top 410 is pressed down until the elastic member 600 is compressed and the FPC substrate 500 comes into contact with the metal-plate convex portion 715, as illustrated in FIG. 11C. This position is the second operation end of the key top 410.

Figure 12:
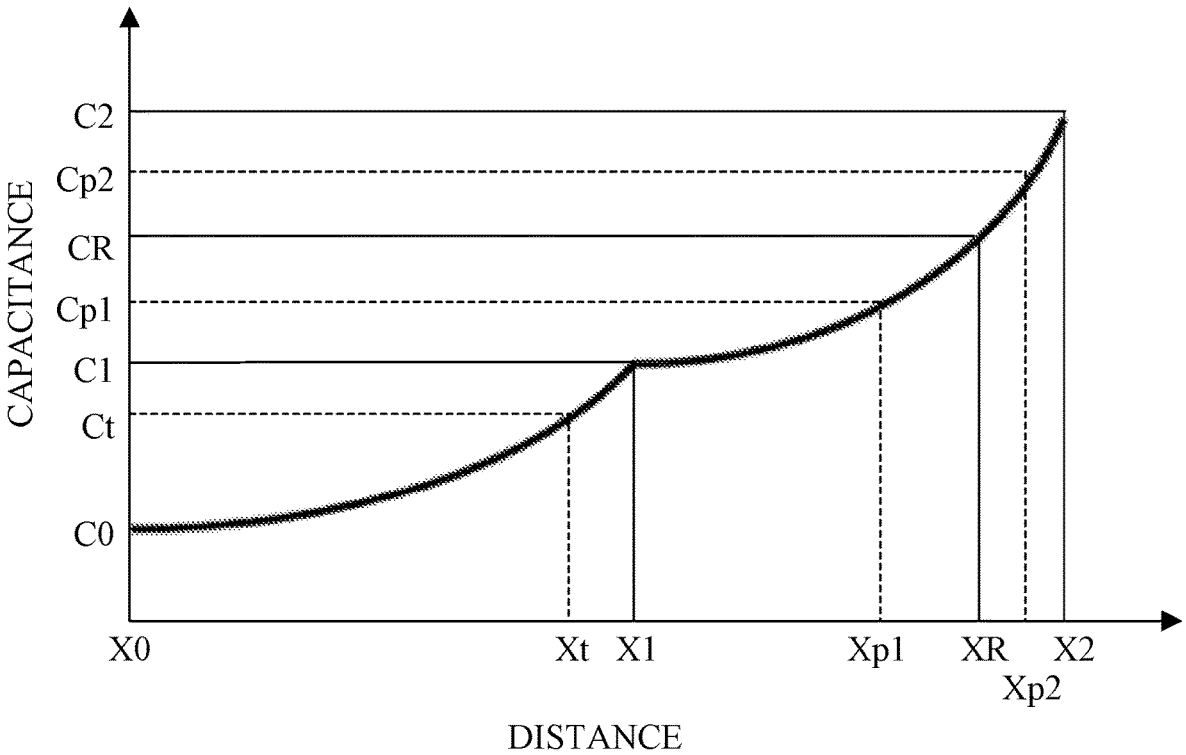
FIG. 12 illustrates a capacitance change in the operation unit according to the second embodiment.

Similarly to FIG. 5, FIG. 12 illustrates a relationship between the distance X and the capacitance C generated in the electrode pattern 510 in this example. X0, X1, C0, C1, and Ct are the same as those in FIG. 5. That is, X0 is the distance between the user's finger and the key top 410 in a case where the user's finger is sufficiently far away from the key top 410, and C0 is the capacitance at the distance X0. X1 is the distance between the electrode pattern 510 and the receiving metal plate 700 at the touch operation position where the user's finger touches the key top 410, and C1 is the capacitance at the distance X1. Ct is a capacitance threshold provided between C0 and C1 for detecting the touch operation. In FIG. 12, XR is a distance between the electrode pattern 510 and the receiving metal plate 700 when the FPC substrate 500 comes into contact with the elastic member 600, and CR is the capacitance at this time.

In this embodiment, an unillustrated processing circuit sets a threshold Cp1 between C1 and CR, and determines that the first press operation has been performed, which is a press operation to the first operation end, in a case where the capacitance of the electrode pattern 510 detected by the capacitance sensor 850 becomes higher than Cp1.

In FIG. 12, X2 is a distance between the electrode pattern 510 and the receiving metal plate 700 in a case where the FPC substrate 500 comes into contact with the metal-plate convex portion 715, and C2 is the capacitance at this time. The processing circuit sets a capacitance threshold Cp2 between CR and C2, and determines a second press operation has been performed, which is a press operation to the second operation end, in a case where the capacitance of the electrode pattern 510 detected by the capacitance sensor 850 becomes higher than Cp2.

The operation unit 400' according to this embodiment can detect three operations to the key top 400: the touch operation, the first press operation, and the second press operation. For example, in an image pickup apparatus that automatically shifts to a sleep mode in a case where there is no operation for a predetermined period, the processing circuit can cancel the sleep mode in response to upon detection of the touch operation and shift to an imaging standby state, and perform AF upon detection of the first press operation. The image pickup apparatus can capture a recording image upon detection of the second press operation.

While the disclosure has described example embodiments, it is to be understood that some embodiments are not limited to the disclosed embodiments. The scope of the following claims is to be accorded the broadest interpretation so as to encompass all such modifications and equivalent structures and functions.

Each embodiment can stably detect a touch operation and a press operation with a simple configuration.

This application claims priority to Japanese Patent Application No. 2023-095992, which was filed on Jun. 12, 2023, and which is hereby incorporated by reference herein in its entirety.

What is claimed is:

1. An operation apparatus to be provided to an electronic apparatus, the operation apparatus comprising:
   an operation member including a touch-sensitive operational surface, configured to receive a touch operation and a press operation each being performed by an object, the press operation moving the operation member from a position where the touch operation is performed;
   a first electrode configured to move as the operation member moves;
   a second electrode disposed so as to change a distance from the first electrode that moves;
   a ground electrode movable as the operation member moves, wherein the ground electrode becomes electrically connected to the second electrode at a movement end of the operation member, and
   a capacitance detecting sensor configured to detect a first capacitance change generated in the first electrode from before the touch operation to the touch operation and further detect a second capacitance change generated in the first electrode as the distance changes by the press operation, wherein the second electrode is electrically connected to an exterior member of the electronic apparatus that is made of conductive metal, and the operation member includes an operation surface that receives the touch operation and the press operation, the operation surface being movable by the press operation from a position outside the exterior member to a position inside the exterior member where the object contacts the exterior member.

2. The operation apparatus according to claim 1, wherein the second electrode includes a metal plate having a metal surface that is exposed on a first electrode side.

3. The operation apparatus according to claim 1, wherein the operation member includes an operation surface that receives the touch operation and the press operation, and the operation surface has a convex surface shape.

4. The operation apparatus according to claim 1, wherein the first electrode is provided on a second electrode side and an operation member side of a substrate, and wherein an area of the first electrode on the second electrode side is larger than an area of the first electrode on the operation member side.

5. An operation apparatus to be provided to an electronic apparatus, the operation apparatus comprising:

an operation member including a touch-sensitive operational surface, configured to receive a touch operation and a press operation that moves the operation member from a position where the touch operation is performed;

a first electrode configured to move as the operation member moves;

a second electrode disposed so as to change a distance from the first electrode that moves;

a ground electrode movable as the operation member moves, wherein the ground electrode becomes electrically connected to the second electrode at a movement end of the operation member;

a capacitance detecting sensor configured to detect a first capacitance change generated in the first electrode from before the touch operation to the touch operation and further detect a second capacitance change generated in the first electrode as the distance changes by the press operation; and an elastic member disposed between the first electrode and the second electrode, wherein the press operation includes a first press operation that moves the operation member together with the first electrode to a first position corresponding to the elastic member, and includes a second press operation that moves the operation member from the first position to a second position where the elastic member is compressed, and wherein the capacitance detector detects the first capacitance change, the second capacitance change including a capacitance change generated by the first press operation and a capacitance change generated by the second press operation.

6. An electronic apparatus comprising an operation apparatus, wherein the operation apparatus includes:

an operation member including a touch-sensitive operational surface, configured to receive a touch operation and a press operation each being performed by an object, the press operation moving the operation member from a position where the touch operation is performed;

a first electrode configured to move as the operation member moves;

a second electrode disposed so as to change a distance from the first electrode that moves;

a ground electrode movable as the operation member moves, wherein the ground electrode becomes electrically connected to the second electrode at a movement end of the operation member, and a capacitance detecting sensor configured to detect a first capacitance change generated in the first electrode from before the touch operation to the touch operation and further detect a second capacitance change generated in the first electrode as the distance changes by the press operation, wherein the second electrode is electrically connected to an exterior member of the electronic apparatus that is made of conductive metal, and the operation member includes an operation surface that receives the touch operation and the press operation, the operation surface being movable by the press operation from a position outside the exterior member to a position inside the exterior member where the object is contactable to the exterior member.

7. The electronic apparatus according to claim 6, wherein the electronic apparatus is configured to control its operation according to a detection result of the capacitance detector.

8. An electronic apparatus comprising an operation apparatus, wherein the operation apparatus includes:

an operation member including a touch-sensitive operational surface, configured to receive a touch operation and a press operation that moves the operation member from a position where the touch operation is performed;

a first electrode configured to move as the operation member input device moves;

a second electrode disposed so as to change a distance from the first electrode that is moving;

a ground electrode movable as the operation member moves, wherein the ground electrode becomes electrically connected to the second electrode at a movement end of the operation member, a capacitance detecting sensor configured to detect a first capacitance change generated in the first electrode from before the touch operation to the touch operation and further detect a second capacitance change generated in the first electrode as the distance changes by the press operation; and an elastic member disposed between the first electrode and the second electrode, wherein the press operation includes a first press operation that moves the operation member together with the first electrode to a first position corresponding to the elastic member, and includes a second press operation that moves the operation member from the first position to a second position where the elastic member is compressed, and wherein the capacitance detector detects the first capacitance change, and the second capacitance change including a capacitance change generated by the first press operation and a capacitance change generated by the second press operation.

9. The electronic apparatus according to claim 8, wherein the electronic apparatus is configured to control its operation according to a detection result of the capacitance detector.

* * * * *